March 17, 1970 V. LIEPINS ET AL 3,501,710

CLASS B TRANSISTOR AMPLIFIER BIASSING CIRCUIT

Filed Feb. 19, 1968

Inventors:
Valdis Liepins
and
Gian Franco Tonion
BY
Baldwin Wight Diller & Brown
ATTORNEYS 3,501,710

CLASS B TRANSISTOR AMPLIFIER BIASSING CIRCUIT

Valdis Liepins and Gian Franco Tonion, Chelmsford, England, assignors to The Marconi Company Limited, London, England, a British company Filed Feb. 19, 1968, Ser. No. 706,546
Claims priority, application Great Britain, Apr. 7, 1967, 16,007/67
Int. Cl. H03f 3/04, 1/30, 3/20
U.S. Cl. 330—22 7 Claims

ABSTRACT OF THE DISCLOSURE

A class B transistor amplifier and a biassing circuit therefor are disclosed. Potential from a bias source is supplied to the base of a biassing transistor, the output from the emitter of which is fed to the base of the class B amplifying transistor through a resistance-shunted base-collector path of a further transistor. The further transistor has its emitter at earth potential, and a variable resistance connected between its collector and base electrode. The collector of the biassing transistor is connected to a terminal of the bias source via two series connected resistances which may be variable. The base of the biassing transistor is tapped upon a potentiometer connected between a terminal of the bias source and point of reference potential.

This invention relates to transistor amplifiers and more specifically to so-called class B transistor amplifiers.

Class B amplifiers are often used where linear power amplification i.e. power amplification in which the output is, as nearly as possible, strictly proportional to the input, is required. The choice of class B amplification in such cases is made because class A amplifiers are relatively inefficient and class C amplifiers produce signal distortion. In cases where good linearity of power amplification is an operational requirement—and amplifiers for single side band operation in radio and like transmitters provide an important example of this—class B amplifiers are usually selected.

As is well known, it is necessary, if a class B amplifier is to provide only low or negligibly small signal distortion over a wide range of powers, for correct biassing to be achieved. This is not difficult in the case of class B valve amplifiers because all that is necessary is to choose a static operating point by applying a suitable bias to the valve grid and thereby obtain stable operation. In the case of a class B transistor amplifier, however, the obtaining of correct bias in practice presents quite serious difficulties because high frequency transistors are very sensitive to temperature changes and have a low secondary breakdown point. While a class B transistor amplifier can be satisfactorily operated, under laboratory conditions, over a wide range of powers by carefully re-adjusting the bias to the best level at each material change of output power it is very difficult to obtain satisfactory operation over a wide range of powers "in the field" where an amplifier may have to function at any number of different frequencies, at different and varying power levels, and subject to perhaps widely varying ambient temperatures in conditions in which a need for repeated bias re-adjustment is not acceptable because the necessary skilled operators are not available or for other practical reasons, Indeed, so far as the present applicants are aware, the long standing problem of providing automatically correct biassing of a class B amplifier operating over a wide range of powers in a wide range of ambient temperatures remains still unsolved. The present invention seeks to solve this problem.

Figure 1:
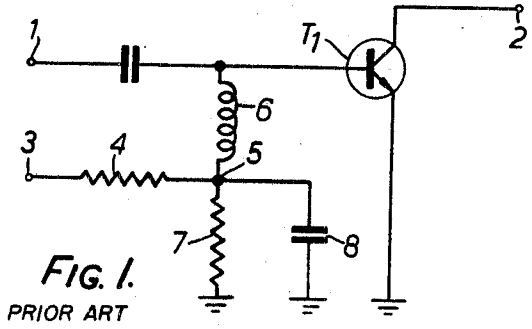
FIG. 1. PRIOR ART
Figure 2:
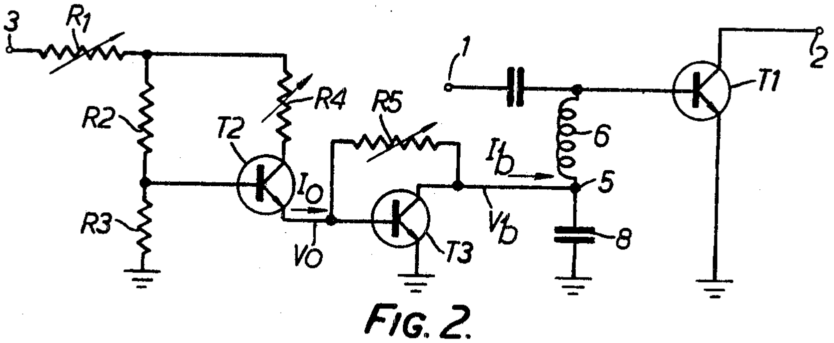
Figure 3:
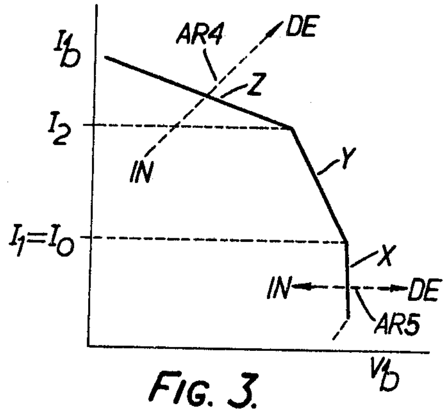

The invention is illustrated in and explained in connection with the accompanying drawings in which FIGURE 1 is a diagram of a well known widely used biassing arrangement and is provided in order to explain some of the difficulties the present invention seeks to avoid; and FIGURE 2 is a diagram of an embodiment of the present invention; and FIGURE 3 is an explanatory graphical figure.

Referring to FIGURE 1, $T_1$ is the transistor for which biassing is to be provided and which works in class B operation. Input signals to be amplified are applied from input terminal 1 through a condenser as shown to the base of the transistor and amplified output is taken off from its collector to the output terminal 2. A positive bias supply (not shown), typically of a voltage between 0 v. and +5 v. is connected to terminal 3. A resistance 4, typically of 100 ohm, connects terminal 3 to the junction point 5 of a radio frequency choke 6 and a resistance 7, the other end of the choke being connected to the base of the transistor and the other end of the resistance 7 being earthed. A condenser 8 shunts the resistance 7. Typical practical values for the elements 7 and 8 are 30 ohm and 0.1 $\mu$fd.

This well known circuit has the following serious practical defects: (1) if the temperature of the transistor junction changes by any material amount the collector current also changes (2) there is considerable wastage of power in order to provide the required low bias source impedance and (3) in order to obtain optimum performance the bias voltage from the source at 3 must be re-adjusted whenever the output power level is materially changed. The present invention provides an improved class B transistor amplifier in which these defects are avoided.

According to this invention a class B transistor amplifier comprises a class B amplifying transistor and a biassing circuit therefore including a biassing transistor to the base of which potential from a bias source is applied and the output from which is fed to the base of the amplifying transistor through a path including a resistance-shunted further transistor having its saturation voltage below the cut-off voltage of said class B amplifying transistor.

Preferably the bias source is connected to the collector of the biassing transistor through a high resistance and the base of said biassing transistor is tapped upon a potentiometer connected between said bias source and earth. Preferably the resistance between the bias source and the biassing transistor collector is adjustable.

Preferably also the emitter of the biassing transistor is directly connected to the base of the further transistor the emitter of which is earthed and the collector of which is connected to the base of the class B amplifying transistor, and an adjustable resistance is connected between the base and the collector of said further transistor.

Referring to FIGURE 2, $T_1$ is again the class B transistor amplifier for which bias is to be provided, the signal input and output terminals being referenced 1 and 2 respectively and 6 and 8 being respectively a radio frequency choke and a condenser as in FIGURE 1. Positive voltage, typically of about +4 v. is applied from a source (not shown) at a terminal 3 which is connected through an adjustable resistance $R_1$ in series with a resistance $R_2$ and a resistance $R_3$ to earth, the junction point of resistance $R_2$ and $R_3$ being connected to the base of a transistor $T_2$. The terminal 3 is also connected through the aforesaid resistance $R_1$ in series with a further resistance $R_4$ to the collector of transistor $T_2$.

The emitter of $T_2$ is connected to the base of a further transistor $T_3$ the emitter of which is earthed and the collector of which is connected to the junction point 5 of choke 6 with condenser 8. An adjustable resistance $R_5$ is connected across the transistor $T_3$ between its base and its collector.

The transistor $T_3$ is selected and arranged to have its saturation voltage below the cut-off voltage of $T_1$ and the resistance $R_5$ is adjusted to provide the required bias voltage $V_b$ from the collector of $T_3$ to the base of $T_1$.

The operation of the bias circuit of FIGURE 2 will be understood from FIGURE 3 which is a graphical figure showing the nature of the bias voltage $V_b$ (abscissae)—bias current $I_b$ (ordinates) characteristic obtained. As will be seen this characteristic has three distinct substantially linear portions X, Y and Z, the precise characteristics being of course determined by the values of the components used. The portion X extends from substantially zero value of bias current $I_b$ ($I_b=0$) to a value of bias current $I_b=I_1$ at which the collector current of $T_3$ is zero. Variation of resistance $R_5$ causes variation of bias voltage $V_b$ over the portion X of the characteristic as indicated by the double arrow-headed broken line $AR_5$ in FIGURE 3, the arrow head marked IN indicating the change effected by increase in $R_5$ and the arrow head marked DE indicating change effected by decrease of the value of $R_5$. Once $R_5$ is adjusted to give a desired value of $V_b$ any variation of bias current $I_b$ over the portion X of the characteristic from $I_b=0$ to $I_b=I_1$ (at which the collector current of $T_3$ is zero) will not result in any change in the bias voltage $V_b$ because, over this portion X any increase in the bias current $I_b$ results in a counterbalancing decrease in the collector current of $T_3$.

Once the bias current has increased to the value $I_b=I_1$, at which the collector current of $T_3$ is zero, any further increase in said bias current will only increase the current through $R_5$ and this will produce a proportional reduction in the bias voltage $V_b$, the circuit now operating over the portion Y of the characteristic of FIGURE 3. Over this portion of the characteristic the voltage $V_o$ at the emitter of the transistor $T_2$ and at the base of the transistor $T_3$ remains constant, the emitter current $I_o$ of transistor $T_2$ flowing through the resistance $R_5$.

The above described action taking place at portion Y of the characteristic of FIGURE 3 continues until the first transistor $T_2$ saturates. Once this happens the circuit works on portion Z of the characteristic of FIGURE 3 and any further increase in bias current beyond the value $I_2$ at which $T_2$ saturates will produce a considerable reduction in $V_o$ because resistance $R_4$ is of relatively high value. Adjustment of the portion Z of the characteristic is produced by adjusting $R_4$ the effect of such adjustment being represented by the double arrow-headed broken line $AR_4$, the effect of increase in $R_4$ being indicated by the arrow head IN and that of decrease of $R_4$ by the arrow head DE.

The circuit of FIGURE 2 has the following valuable advantages:

(1) Once the bias point is set it remains at the optimum value despite changes in output power level.

(2) The circuit provides a very low bias source impedance.

(3) It is economical of power and wastes very little.

(4) If the transistor $T_3$ is subjected to substantially the same temperature as the biassed transistor $T_1$ and has a similar temperature characteristic the circuit will operate satisfactorily over a wide range of temperatures without need to reset the bias adjustments.

(5) A single bias circuit can be used to bias a plurality of transistors, such as $T_1$, operating in parallel and (6) The circuit may be designed or adjusted to produce a desired shape of characteristic, of the nature of the characteristic of FIGURE 3, to suit the requirements of particular transistors.

We claim:

1. A class B transistor amplifier comprising a class B amplifying transistor and a biassing circuit therefor, including a biassing transistor to the collector of which a voltage is coupled, to the base of which a potential from a bias source is applied, and output from the emitter of which is fed to the base of said amplifying transistor through a path including a resistance-shunted base-collector path of a further transistor, said further transistor having its collector-emitter saturation voltage below the cut-off voltage of said class B amplifying transistor.

2. An amplifier as claimed in claim 1 wherein the bias source is connected to the collector of the biassing transistor through a high resistance and the base of said biassing transistor is tapped upon a potentiometer connected between said bias source and a point of reference potential.

3. An amplifier as claimed in claim 2 wherein the resistance between the bias source and the biassing transistor collector is adjustable.

4. An amplifier as claimed in claim 3 wherein the emitter of the biassing transistor is directly connected to the base of the further transistor the emitter of which is connected to a point of reference potential and the collector of which is connected to the base of the class B amplifying transistor, and an adjustable resistance is connected between the base and the collector of said further transistor.

5. An amplifier as claimed in claim 1 wherein the collector of said biassing transistor is coupled to said bias source via at least one variable resistance.

6. An amplifier as claimed in claim 5 wherein said at least one variable resistance is two variable resistances connected in series, and a voltage divider is connected between the junction of said two variable resistances and a point of reference potential, the base of said biassing transistor being coupled to a point on said voltage divider for the application thereto of said potential from said bias source.

7. An amplifier as claimed in claim 6 wherein said emitter of said biassing transistor is connected to said point of reference potential via the base-emitter path of said further transistor.

References Cited

UNITED STATES PATENTS 3,374,442 3/1968 Griffin ------------ 330—22 X

ROY LAKE, Primary Examiner

S. H. GRIMM, Assistant Examiner

U.S. Cl. X.R.

330—40